United States Patent
Modock

(10) Patent No.: US 9,373,428 B2
(45) Date of Patent: Jun. 21, 2016

(54) FLEXIBLE DEVICE FOR ELECTRICALLY CONNECTING AN ELECTRIC COMPONENT AND A PRINTED CIRCUIT BOARD TOGETHER, SYSTEM, AND METHOD FOR MOUNTING A SYSTEM

(75) Inventor: Pascal Modock, Gonesse (FR)

(73) Assignee: Johnson Controls Technology Company, Holland, MI (US)

( * ) Notice: Subject to any disclaimer, the term of this patent is extended or adjusted under 35 U.S.C. 154(b) by 124 days.

(21) Appl. No.: 13/883,499

(22) PCT Filed: Sep. 29, 2011

(86) PCT No.: PCT/EP2011/004870
§ 371 (c)(1),
(2), (4) Date: Jul. 17, 2013

(87) PCT Pub. No.: WO2012/059159
PCT Pub. Date: May 10, 2012

(65) Prior Publication Data
US 2013/0284483 A1   Oct. 31, 2013

(30) Foreign Application Priority Data

Nov. 6, 2010 (DE) .......................... 10 2010 050 700
Apr. 11, 2011 (FR) ...................................... 11 01109

(51) Int. Cl.
*H05K 1/11* (2006.01)
*H05K 3/32* (2006.01)
(Continued)

(52) U.S. Cl.
CPC .................. *H01B 7/08* (2013.01); *H01R 12/62* (2013.01); *H05K 1/147* (2013.01); *H05K 1/189* (2013.01);
(Continued)

(58) Field of Classification Search
CPC ............................... H05K 1/118; H05K 3/326
USPC ............................. 361/749; 174/254; 29/832
See application file for complete search history.

(56) References Cited

U.S. PATENT DOCUMENTS 4,127,740 A * 11/1978 LaMarche ............ H01H 13/702
  174/254
4,251,683 A * 2/1981 Oughton, Jr. ........ H01H 13/702
  174/117 FF (Continued)

FOREIGN PATENT DOCUMENTS

EP          0 272 707 A2   6/1988
WO    WO 01/51883 A1      7/2001

OTHER PUBLICATIONS

International search report received in connection with international application No. PCT/EP2011/004870; dtd Feb. 10, 2012.

(Continued)

*Primary Examiner* — Jeremy C Norris
*Assistant Examiner* — Nathan Milakovich
(74) *Attorney, Agent, or Firm* — Foley & Lardner LLP

(57) ABSTRACT

A flexible device for electrically connecting an electric component and a printed circuit board together includes a main extension direction, and the flexible electric-connection device includes a first contact region formed at one end of the flexible electric-connection device in the main extension direction, as well as a second contact region formed at the other end of the flexible electric-connection device in the main extension direction. The flexible electric-connection device includes a stiffener, or the flexible electric connection device is combined with a supporting element. The electric component is provided so as to be in direct electric contact with the flexible electric-connection device via the first contact region.

10 Claims, 4 Drawing Sheets

(51) Int. Cl.
  *H01B 7/08*   (2006.01)
  *H01R 12/62*  (2011.01)
  *H05K 1/14*   (2006.01)
  *H05K 1/18*   (2006.01)

(52) U.S. Cl.
  CPC  *H05K 3/32* (2013.01); *H05K 1/118* (2013.01); *H05K 2201/10053* (2013.01); *H05K 2201/10189* (2013.01); *H05K 2201/2009* (2013.01); *Y10T 29/4913* (2015.01)

(56) References Cited

U.S. PATENT DOCUMENTS

| | | | | |
|---|---|---|---|---|
| 4,296,457 A | | 10/1981 | Hahlganss | |
| 4,623,768 A | * | 11/1986 | Gnant | H01H 13/702 200/5 A |
| 4,716,500 A | * | 12/1987 | Payne | 361/750 |
| 5,224,023 A | * | 6/1993 | Smith et al. | 361/784 |
| 5,844,783 A | * | 12/1998 | Kojima | 361/777 |
| 5,848,462 A | * | 12/1998 | Sera et al. | 29/622 |
| 6,497,035 B1 | * | 12/2002 | Ratliff | 29/596 |
| 6,536,871 B1 | * | 3/2003 | Haddick | B41J 2/1408 347/50 |
| 7,439,449 B1 | * | 10/2008 | Kumar et al. | 174/254 |
| 7,446,261 B2 | * | 11/2008 | Kumar et al. | 174/254 |
| 8,508,947 B2 | * | 8/2013 | Ganesan et al. | 361/749 |
| 2002/0093793 A1 | | 7/2002 | Simon | |
| 2011/0255250 A1 | * | 10/2011 | Dinh et al. | 361/749 |
| 2014/0140018 A1 | * | 5/2014 | Malek et al. | 361/749 |

OTHER PUBLICATIONS

Written Opinion of the International Searching Authority dated May 20, 2014 in corresponding International Application No. PCT/EP2011/004870.

\* cited by examiner

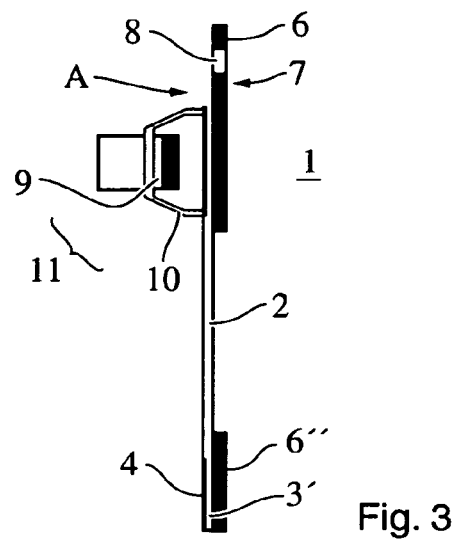
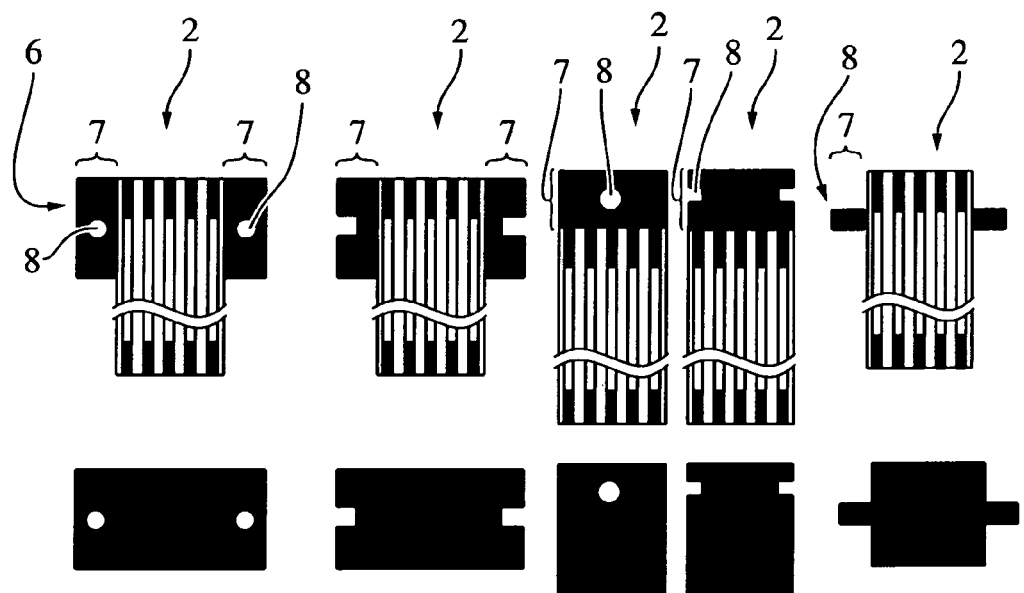
Fig. 3
Fig. 4  Fig. 5  Fig. 6  Fig. 7  Fig. 8

FLEXIBLE DEVICE FOR ELECTRICALLY CONNECTING AN ELECTRIC COMPONENT AND A PRINTED CIRCUIT BOARD TOGETHER, SYSTEM, AND METHOD FOR MOUNTING A SYSTEM

CROSS REFERENCE TO RELATED APPLICATIONS

The present application is a National Stage of International Application No. PCT/EP2011/004870filed on Sept. 29, 2011, which claims the benefit of German Patent Application No. 10 2010 050 700.8filed on Nov. 6, 2010and French Patent Application No. 11/01109filed on Apr. 11, 2011, the entire disclosures of which are incorporated herein by reference.

The present invention relates, on the one hand, to a flexible electrical connecting device, notably for a motor vehicle, between an electrical component and a printed circuit board, and on the other hand, a system and a method for mounting such a system.

It is now routine practice to connect the electrical components to a mother printed circuit board by means of flat flexible cables (FFC) or by means of a flexible printed circuit (FPC). Such an electrical component may be for example a switch, a button or a control station that must be accessible to a user, notably the driver, of a vehicle in which the flexible electrical connecting device is mounted. The routine solutions of such a flexible electrical connection provide that the electrical component is contacted and attached to a satellite printed circuit board of the mother printed circuit board and that the flat flexible cable or the flexible printed circuit that connects the satellite printed circuit board to the mother printed circuit board is attached at two ends by means of a connector with both the mother printed circuit board and the satellite printed circuit board respectively.

Although the aforementioned solution is satisfactory, it is costly because of the expenses that are associated therewith. Naturally, providing two printed circuit boards (mother and satellite) and two connectors for connecting the flat flexible cable or the flexible printed circuit at one of its ends to the mother printed circuit board and at the other of its ends to the satellite printed circuit board is costly and consequently the cost prices of such a system are high.

The main object of the present invention is to alleviate the drawbacks of the prior art and notably those cited above, and has the further object of proposing a flexible electrical connecting device between, on the one hand, an electrical component and, on the other hand, a printed circuit board, and a printed-circuit-board system and a method of mounting a printed-circuit-board system so as to reduce to the minimum the costs associated with the elements required and also to reduce the costs associated with the process of mounting the printed-circuit-board system.

According to the invention, this object is achieved by a device for the flexible electrical connection between, on the one hand, an electrical component and, on the other hand, a printed circuit board, the flexible electrical connecting device comprising a main extension direction, the flexible electrical connecting device comprising a first contact region made at one end of the flexible electrical connecting device in the main extension direction, the flexible electrical connecting device comprising a second contact region made at the other end of the flexible electrical connecting device in the main extension direction, the electrical component being designed to be in direct electrical contact with the flexible electrical connecting device by means of the first contact region, and the flexible electrical connecting device comprising a stiffening element or the flexible electrical connecting device being associated with a supporting element.

By means of such an embodiment of the flexible electrical connecting device, it is advantageously possible according to the present invention that a satellite printed circuit board can be omitted. Consequently, it is possible to reduce the costs of the system not only by deducting the costs associated with the satellite printed circuit board but also by deducting the costs associated with the mounting and the assembly of the satellite printed circuit board with the flexible electrical connecting device. Moreover, it is possible according to the present invention that the costs of the system can be reduced by the costs for a second connecting element which, according to the prior art, is used to provide the electrical contact between the flexible electrical connecting device and the satellite printed circuit board.

According to the present invention, it is possible, according to a portion of the embodiments, that the flexible electrical connecting device comprises a stiffening element or, according to another portion of the embodiments, that the flexible electrical connecting device comprises no stiffening element, but that the flexible electrical connecting device is associated with a supporting element which confers on the first contact region a sufficient rigidity for the contact with the electrical component to be possible in a secure manner.

A preferred enhancement of the invention lies in the fact that the flexible electrical connecting device is a flat flexible cable (FFC) or a flexible printed circuit (FPC).

By means of such an embodiment of the flexible electrical connecting device, it is advantageously possible to make a connection between a printed circuit board, on the one hand, and an electrical component, such as a switch, on the other hand, in a very economical manner, notably by using a flat flexible cable (FFC), or in an adapted manner by means of a flexible printed circuit (FPC).

A preferred enhancement of the invention lies in the fact that the stiffening element is attached to the flexible electrical connecting device by welding of plastic materials.

By means of such an embodiment of the attachment of the stiffening element to the flexible electrical connecting device, it is advantageously possible to provide a support for the electrical component in a very economical manner and nevertheless in a mechanically stable and durable manner. For example, it is advantageously possible that the stiffening element is manufactured during the manufacture or the assembly of the flexible electrical connecting device, that is to say during the manufacture of the flat flexible cable or of the flexible printed circuit.

According to yet another preferred embodiment of the invention, the stiffening element is designed in a single piece with the flexible electrical connecting device.

By means of such an embodiment of the flexible electrical connecting device, it is advantageously possible that the manufacture is made yet more economical by virtue of an integral or at least partially integral manufacture of the stiffening element and of the flexible electrical connecting device.

According to a preferred embodiment of the flexible electrical connecting device according to the present invention, on the one hand, the first contact region and, on the other hand, the stiffening element are provided on opposite sides of the flexible electrical connecting device.

By means of such an embodiment of the flexible electrical connecting device, it is advantageously possible to confer on the end of the flexible electrical connecting device a large degree of stability through the stiffening element which is preferably positioned on the other side of the first contact region relative to the conductive metal tracks.

According to another preferred embodiment of the flexible electrical connecting device according to the present invention, the flexible electrical connecting device comprises a fastening element designed to attach the first contact region of the flexible electrical connecting device.

By means of such an embodiment, the stiffening element and therefore one end of the flexible electrical connecting device can simply be attached or fastened to a supporting element, for example a portion of a box or a portion of a component of the interior of a vehicle. According to the present invention, the fastening element may advantageously be a recess or a hole or an element for clipping the stiffening element.

According to yet another preferred embodiment of the invention, the flexible electrical connecting device comprises a fastening region in which the fastening element is positioned.

According to another preferred embodiment of the flexible electrical connecting device according to the present invention, in the fastening region, the stiffening element protrudes beyond the first contact region
- relative to the main extension direction of the flexible electrical connecting device, and/or
- relative to a direction orthogonal to the main extension direction of the flexible electrical connecting device.

By means of such an embodiment of the flexible electrical connecting device, it is simply and effectively possible to adapt the flexible electrical connecting device such that one of its ends supporting the electrical component can be attached in different locations but notably in a vehicle.

The present invention also relates to a printed-circuit-board system comprising
- a printed circuit board,
- an electrical component, and
- a flexible electrical connecting device, the flexible electrical connecting device being provided between, on the one hand, the electrical component and, on the other hand, the printed circuit board, the flexible electrical connecting device comprising a main extension direction, the flexible electrical connecting device comprising a first contact region made at one end of the flexible electrical connecting device in the main extension direction, the flexible electrical connecting device comprising a second contact region made at the other end of the flexible electrical connecting device in the main extension direction, the second contact region being connected to the printed circuit board by means of a connecting element, the electrical component being designed to be in direct electrical contact with the flexible electrical connecting device through the first contact region, and
- the flexible electrical connecting device comprising a stiffening element or
- the flexible electrical connecting device being associated with a supporting element.

The printed-circuit-board system according to the present invention comprises a printed circuit board (that is to say a mother printed circuit board according to the prior art), an electrical component, notably a switch, and a flexible electrical connecting device for electrically connecting the electrical component to the printed circuit board by using the flexible electrical connecting device according to the present invention. All the preferred embodiments of the flexible electrical connecting device also refer to the printed-circuit-board system.

Moreover, the present invention also relates to a method for mounting a printed-circuit-board system comprising
- a printed circuit board,
- an electrical component, and
- a flexible electrical connecting device, the flexible electrical connecting device being provided between, on the one hand, the electrical component and, on the other hand, the printed circuit board, the flexible electrical connecting device comprising a main extension direction, the flexible electrical connecting device comprising a first contact region made at one end of the flexible electrical connecting device in the main extension direction, the flexible electrical connecting device comprising a second contact region made at the other end of the flexible electrical connecting device in the main extension direction,
- the flexible electrical connecting device comprising a stiffening element or
- the flexible electrical connecting device being associated with a supporting element, the mounting method comprising the following steps:
- a step during which the second contact region is connected to the printed circuit board by means of a connecting element, and
- a step during which the electrical component is placed in direct electrical contact with the flexible electrical connecting device through the first contact region.

Through the method for mounting a printed-circuit-board system according to the present invention, it is advantageously possible to assemble such a system connecting an electrical component to a printed circuit board in a simple and effective manner.

Other features and advantages of the invention will emerge on reading the following description of a particular, nonlimiting embodiment of the invention.

BRIEF DESCRIPTION OF THE DRAWINGS

The invention will be better understood by virtue of the following description which relates to preferred embodiments given as nonlimiting examples and explained with reference to the appended schematic drawings in which:

FIG. 3 is a schematic side view of the flexible electrical connecting device according to the second embodiment according to the present invention, FIGS. 4 to 8 are schematic front views of a flexible electrical connecting device according to other embodiments according to the present invention.

DESCRIPTION OF THE DRAWINGS

Figure 1:
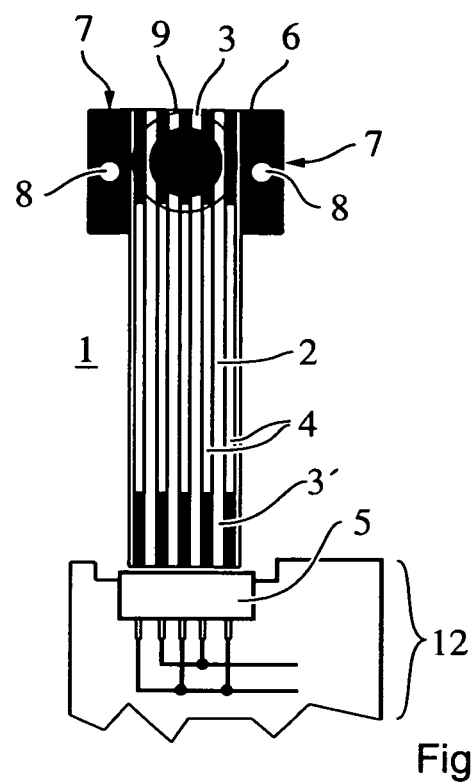
FIG. 1 is a schematic front view of a flexible electrical connecting device according to a first embodiment according to the present invention.

In FIG. 1, a schematic front view of a flexible electrical connecting device according to a first embodiment according to the present invention is shown. The flexible electrical connecting device 2 is notably a flat flexible cable (FFC) or a flexible printed circuit (FPC).

Figure 2:
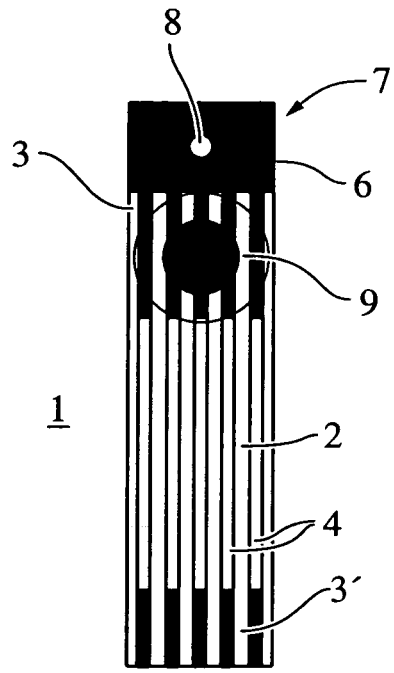
FIG. 2 is a schematic front view of a flexible electrical connecting device according to a second embodiment according to the present invention.
Figure 9:
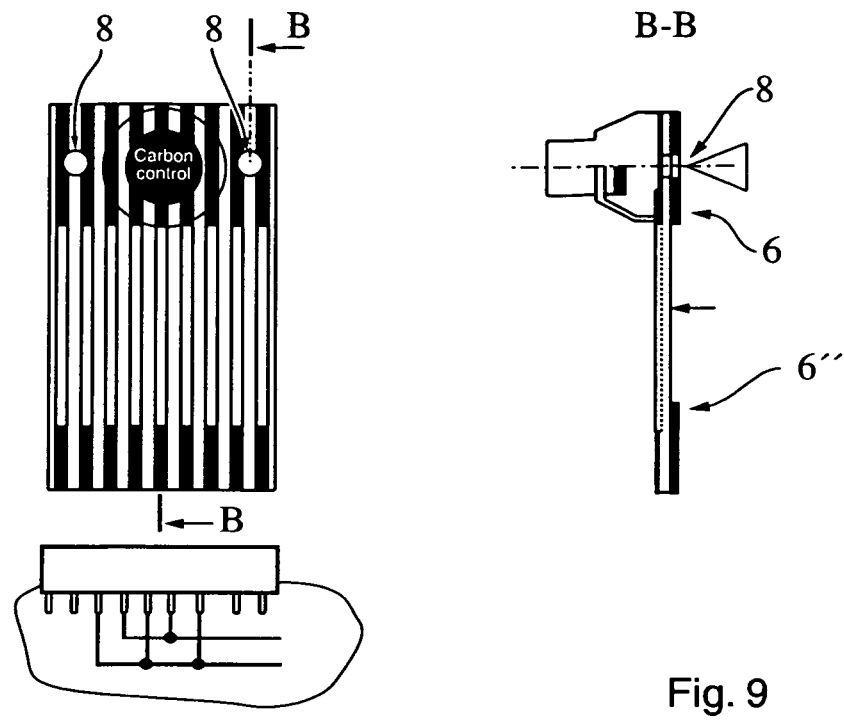
FIG. 9 represents schematic front and side views of a flexible electrical connecting device according to a third embodiment according to the present invention.

FIG. 2 shows a schematic front view of a flexible electrical connecting device 2 according to a second embodiment according to the present invention, and FIG. 3 represents a schematic side view of the second embodiment of a flexible electrical connecting device 2.

FIGS. 4 to 8 represent schematic front views of a flexible electrical connecting device according to other embodiments according to the present invention.

FIGS. 9 to 12 represent schematic front and side views of a flexible electrical connecting device according to a third, fourth, fifth and sixth embodiment according to the present invention.

In all the embodiments according to the present invention, the flexible electrical connecting device 2 comprises a flexible cable comprising a multitude of conductive tracks 4 which are preferably insulated from one another. The flexible electrical connecting device 2 connects an electrical component 11, for example a switch, to a printed circuit board 12. The electrical component 11 is represented only in FIG. 3 but is also found in FIGS. 1 and 2. The assembly of the flexible electrical connecting device 2, the electrical component 11 and the printed circuit board 12 is also called the system 1 of the printed circuit board.

The flexible electrical connecting device 2 comprises a first contact region 3 and a second contact region 3'. The first contact region 3 is made at one end (in a main extension direction of the flexible electrical connecting device 2) of the flexible electrical connecting device 2. The second contact region 3' is provided at the other end (in the main extension direction) of the flexible electrical connecting device 2. According to the present invention, the electrical component 11 is designed to be placed in direct electrical contact with the flexible electrical connecting device through the first contact region 3, that is to say in direct electrical contact of at least a portion of the conductive tracks 4 of the flexible electrical connecting device 2. This means that there is no need to provide a satellite printed circuit board to contact the electrical component 11, but the electrical component 11 is directly contacted with the flexible electrical connecting device 2. In the first contact region 3 and in the second contact region 3', the insulation of the conductive tracks 4 is removed. The second contact region 3' is notably designed, according to the present invention, to be inserted into a connecting element 5 in order to provide the connectivity between the flexible electrical connecting device 2 and the printed circuit board 12. The connecting element 5 may be a conventional connector, notably a low insertion force (LIF) or a zero insertion force (ZIF) connector. According to a preferred embodiment of the present invention, the flexible electrical connecting device 2 comprises another stiffening element 6" also in the second contact region 3'. Such another stiffening element 6" is shown in FIGS. 3, 9, 10, 11 and 12.

According to a first portion of the embodiments of the present invention (cf. notably FIGS. 1 to 9 and 11), the flexible electrical connecting device 2 comprises a stiffening element 6.

According to another portion of the embodiments of the present invention (cf. notably FIGS. 10 and 12), the flexible electrical connecting device 2 does not comprise the stiffening element 6, but the flexible electrical connecting device 2 is associated with a supporting element 6' which confers on the first contact region 3 a sufficient rigidity for the contact with the electrical component 11 to be possible in a secure manner.

When the flexible electrical connecting device 2 comprises the stiffening element 6, the latter is located in the first contact region 3 or in the location (in the main extension direction of the flexible electrical connecting device 2) of the first contact region 3. According to one embodiment of the flexible electrical connecting device 2, the stiffening element 6 is attached to the flexible electrical connecting device 2 at the end of the first contact region 3. According to another embodiment according to the present invention, this stiffening element 6 is made in one piece with the flexible electrical connecting device 2 at the end of the first contact region 3. When the stiffening element 6 is attached to the flexible electrical connecting device 2, these two elements can be welded or bonded or otherwise attached. The stiffening element 6 may, for example, be a part made of plastic or a metal sheet.

According to the present invention, it is preferred that the stiffening element 6 is on the side opposite to the first contact region 3 relative to the conductive tracks 4 of the flexible electrical connecting device 2.

At the end of the first contact region 3, the flexible electrical connecting device 2 may comprise a fastening element 8. Equally, at the end of the first contact region 3, the flexible electrical connecting device 2 may comprise a fastening region 7, the fastening element 8 being notably positioned in the fastening region 7.

For example, the fastening region 7 may be designed such that the stiffening element 6 protrudes beyond the flexible electrical connecting device 2 relative to the main extension direction of the flexible electrical connecting device 2 (cf. FIG. 2) and/or relative to a direction orthogonal to the main extension direction of the flexible electrical connecting device 2 (cf. FIG. 1). Other variants of such embodiments are possible as shown in FIGS. 4 to 8:

- according to the embodiment of FIG. 4, the fastening region 7 is designed such that the stiffening element 6 protrudes beyond the flexible electrical connecting device 2 relative to a direction orthogonal to the main extension direction of the flexible electrical connecting device 2, and a recess 8 (in the form of a hole) is provided as a fastening element 8,
- according to the embodiment of FIG. 5, the fastening region 7 is designed such that the stiffening element 6 protrudes beyond the flexible electrical connecting device 2 relative to a direction orthogonal to the main extension direction of the flexible electrical connecting device 2, and a recess 8 is provided as a fastening element 8,
- according to the embodiment of FIG. 6, the fastening region 7 is designed such that the stiffening element 6 protrudes beyond the flexible electrical connecting device 2 relative to the main extension direction of the flexible electrical connecting device 2, and a recess 8 (in the form of a hole) is provided as a fastening element 8,
- according to the embodiment of FIG. 7, the fastening region 7 is designed such that the stiffening element 6 protrudes beyond the flexible electrical connecting device 2 relative to the main extension direction of the flexible electrical connecting device 2, and a recess 8 is provided as a fastening element 8,
- according to the embodiment of FIG. 8, the fastening region 7 is designed such that the stiffening element 6 protrudes beyond the flexible electrical connecting device 2 relative to a direction orthogonal to the main extension direction of the flexible electrical connecting device 2, and a pin 8 is provided as a fastening element 8.

The polarity of the conductive tracks 4 in the flexible electrical connecting device is notably designed in an alternating manner.

The electrical component 11 is connected to the flexible electrical connecting device 2 in a direct manner through the first contact region 3. If the electrical component 11 is a switch, a contact element 9 of the switch 11 may be produced such that the contact element 9 can be moved and contact different conductive tracks 4 in the first contact region 3 when a user presses on the switch 11 or the contact element 9 is positioned away from the first contact region 3 such that the switch 11 is open. The switch 11 also comprises an edge element 10 which is associated with the contact element 9 in order to carry out the functionality of a switch. Notably, it is possible that the edge element 10 is made of a flexible material notably of rubber or of a material comparable to rubber.

In the representation of FIG. 3 (and of FIGS. 9, 10, 11 and 12), the switch 11 (and the contact element 9) is shown in its open position, that is to say that the contact element 9 is positioned away from the surface of the first contact region 3. When the switch 11 is actuated by a user, the contact element is brought closer to the surface of the first contact region 3 such that at least two tracks, of the conductive tracks 4, are contacted.

The length (and the width and the number of conductive tracks 4) of the flexible electrical connecting device 2 may be adapted to the requirements of the vehicle such that the switch 11 or the electrical component 11 may also be positioned in a location relatively distant from the printed circuit board 12.

According to a third, fourth, fifth and sixth embodiment of the present invention (shown in FIGS. 9, 10, 11 and 12), the flexible electrical connecting device 2 may be designed to have at least partially a width to satisfy the requirements of attachment or of stability in the first contact region 3. Thus, the flexible electrical connecting device 2 comprises (at least partially in the main extension direction of the flexible electrical connecting device 2) a number of conductive tracks 4 that is greater than the number used to electrically connect the electrical component 11. In such a way, it is possible to maintain the width of the flexible electrical connecting device 2 in its first contact region 3 (relative, for example, to the first embodiment) without the stiffening element 6 protruding beyond the flexible electrical connecting device 2 relative to a direction orthogonal to the main extension direction of the flexible electrical connecting device 2. The third and fifth embodiments (FIGS. 9 and 11) show examples of such an embodiment. In the fifth embodiment (FIG. 11), the width of the flexible electrical connecting device 2 is reduced after its first contact region 3, that is to say the width is reduced notably toward the second contact region 3'.

Figure 10:
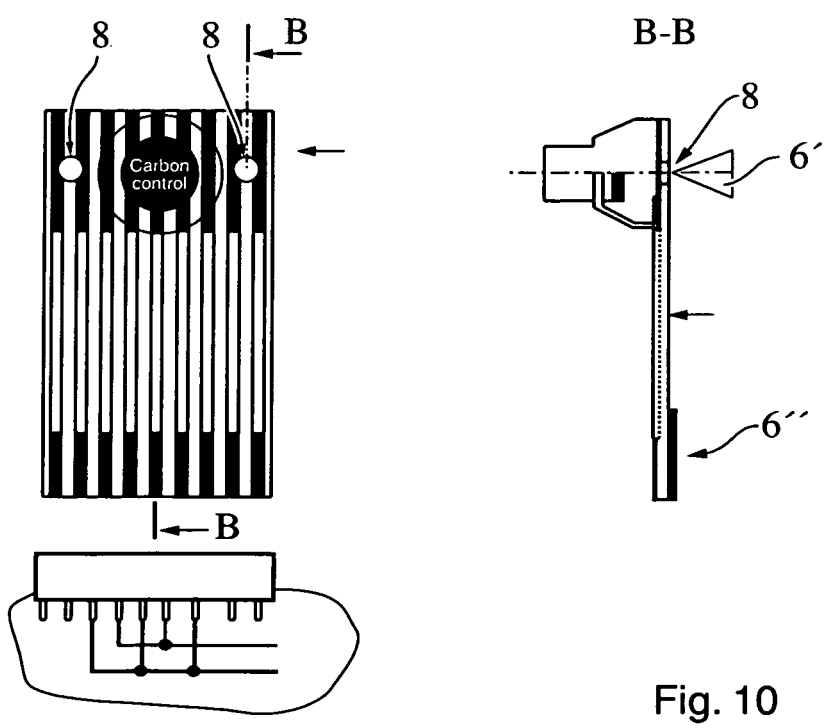
FIG. 10 represents schematic front and side views of a flexible electrical connecting device according to a fourth embodiment according to the present invention.
Figure 11:
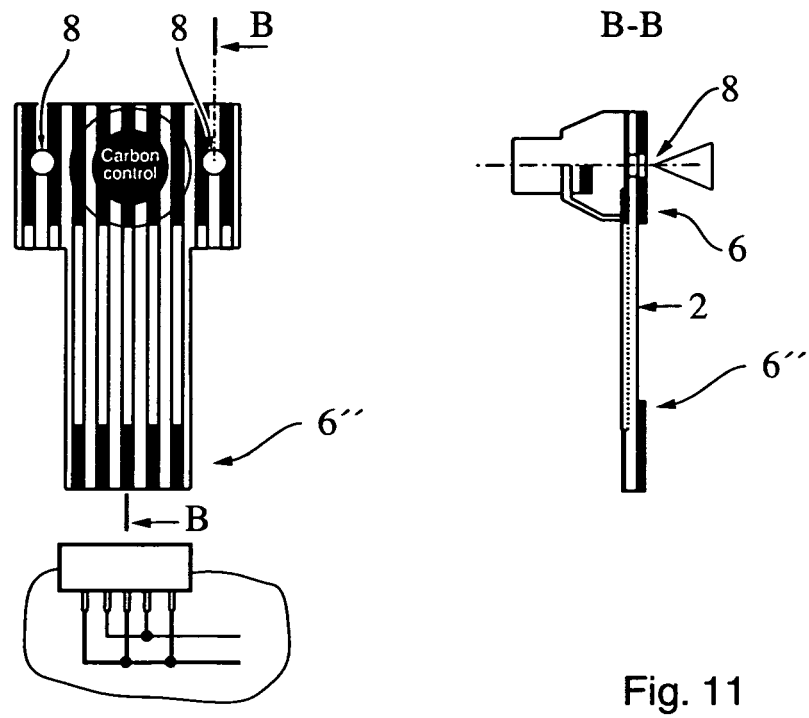
FIG. 11 represents schematic front and side views of a flexible electrical connecting device according to a fifth embodiment according to the present invention.
Figure 12:
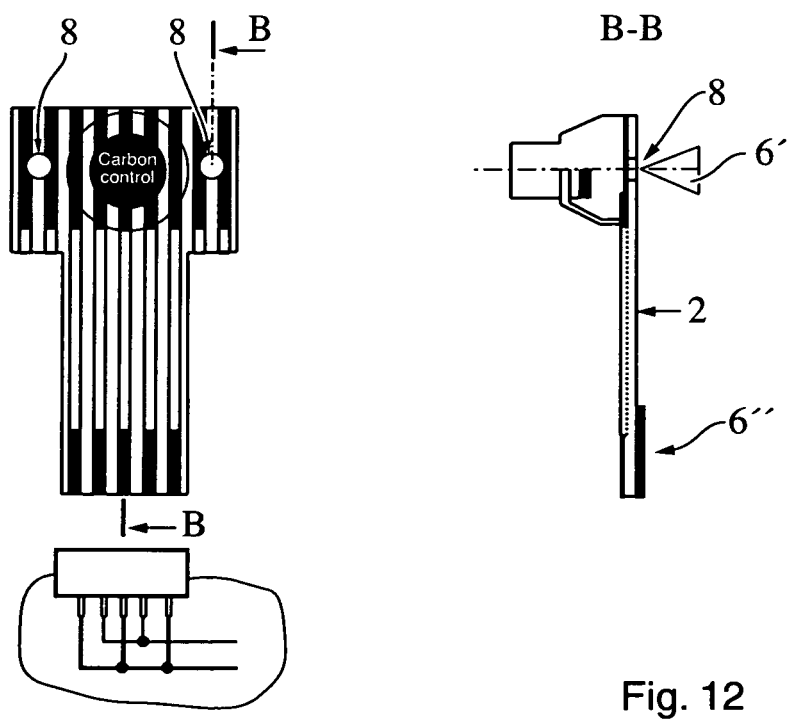
FIG. 12 represents schematic front and side views of a flexible electrical connecting device according to a sixth embodiment according to the present invention.

According to the fourth and sixth embodiments of the present invention, shown in FIGS. 10 and 12, the flexible electrical connecting device 2 does not contain the stiffening element 6, but the flexible electrical connecting device 2 is associated with a supporting element 6' which confers on the first contact region 3 a sufficient rigidity for the contact with the electrical component 11 to be possible in a secure manner. Preferably, the supporting element 6' is for example an abutment to which the flexible electrical connecting device 2 is attached. When the electrical component rests (for example the contact element 9) on the flexible electrical connecting device 2 in its first contact region 3, the flexible electrical connecting device 2 is held by the supporting element 6'.

The flexible electrical connecting device 2 and the printed-circuit-board system 1 may be used anywhere where a relatively great distance is provided between an electrical component 11 such as notably a common switch and a printed circuit board 12 (that is to say a mother printed circuit board) is required, notably in a combination instrument, in an element for controlling the air conditioning of the vehicle and/or to control other control interfaces such as the actuation of video screens that are installed for the rear passengers.

LIST OF REFERENCE SYMBOLS

1 Printed-circuit-board system
2 Flexible electrical connecting device
3 First contact region
3' Second contact region
4 Conductive tracks
5 Connecting element
6 Stiffening element
7 Fastening region
8 Fastening element
9 Contact element
10 Edge element
11 Electrical component
12 Printed circuit board

The invention claimed is:

1. A flexible electrical connecting device for a flexible electrical connection between an electrical component and a printed circuit board, the flexible electrical connecting device comprising:
   a first contact region made at one end of the flexible electrical connecting device in a main extension direction of the flexible electrical connecting device;
   a second contact region made at the other end of the flexible electrical connecting device in the main extension direction; and
   a plurality of conductive tracks which are insulated between the first contact region and the second contact region and are uninsulated in the first contact region and in the second contact region;
   wherein the flexible electrical connecting device includes a stiffening element or the flexible electrical connecting device is associated with a supporting element,
   wherein the electrical component is in direct electrical contact with the flexible electrical connecting device and in direct electrical connection with at least two of the plurality of conductive tracks in the first contact region; and
   wherein the electrical component is a switch including a contact element which is in direct electrical connection with the at least two of the plurality of the conductive tracks in the first contact re ion when the switch is depressed and wherein the switch further comprises an edge element which is associated with the contact element, wherein the edge element is configured to carry out the functionality of the switch, wherein the edge element comprises a flexible material.

2. The flexible electrical connecting device as claimed in claim 1, wherein the flexible electrical connecting device is a flat flexible cable or a flexible printed circuit.

3. The flexible electrical connecting device as claimed in claim 1 wherein the stiffening element is attached to the flexible electrical connecting device by welding of plastic materials, and wherein the stiffening element is plastic.

4. The flexible electrical connecting device as claimed in claim 1 wherein the stiffening element is designed in a single piece with the flexible electrical connecting device.

5. The flexible electrical connecting device as claimed in claim 1 wherein the first contact region and the stiffening element are provided on opposite sides of the flexible electrical connecting device.

6. The flexible electrical connecting device as claimed in claim 1 wherein the flexible electrical connecting device comprises a fastening element designed to fasten the first contact region of the flexible electrical connecting device.

7. The flexible electrical connecting device as claimed in claim 6 comprising a fastening region in which the fastening element is positioned.

8. The flexible electrical connecting device as claimed in claim 7, wherein, in the fastening region, the stiffening element protrudes beyond the flexible electrical connecting device
- relative to the main extension direction of the flexible electrical connecting device, and/or
- relative to a direction orthogonal to the main extension direction of the flexible electrical connecting device.

9. A printed-circuit-board system comprising:
- a printed circuit board;
- an electrical component; and
- a flexible electrical connecting device, the flexible electrical connecting device being provided between the electrical component and the printed circuit board, the flexible electrical connecting device comprising:
  - a first contact region made at one end of the flexible electrical connecting device in a main extension direction the flexible electrical connecting device, and
  - a second contact region made at the other end of the flexible electrical connecting device in the main extension direction, the second contact region being connected to the printed circuit board by a connecting element; and
  - a plurality of conductive tracks which are insulated between the first contact region and the second contact region and are uninsulated in the first contact region and in the second contact region,
  - wherein the flexible electrical connecting device comprises a stiffening element or the flexible electrical connecting device is associated with a supporting element, and wherein the electrical component is in direct electrical contact with the flexible electrical connecting device and in direct electrical connection with at least two of the plurality of conductive tracks in the first contact region; and
- wherein the electrical component is a switch including a contact element which is in direct electrical connection with the at least two of the plurality of the conductive tracks in the first contact region when the switch is depressed, and wherein the switch further comprises an edge element which is associated with the contact element, wherein the edge element is configured to carry out the functionality of the switch, wherein the edge element comprises a flexible material.

10. A method for mounting a printed-circuit-board system comprising:
- a printed circuit board, an electrical component, and a flexible electrical connecting device, the flexible electrical connecting device being provided between the electrical component and the printed circuit board the flexible electrical connecting device comprising a first contact region made at one end of the flexible electrical connecting device in a main extension direction of the flexible electrical connecting device, a second contact region made at the other end of the flexible electrical connecting device in the main extension direction, and a plurality of conductive tracks which are insulated between the first contact region and the second contact region and are uninsulated in the first contact region and in the second contact region, wherein the flexible electrical connecting device comprises a stiffening element or the flexible electrical connecting device is associated with a supporting element, the method comprising:
- connecting the second contact region to the printed circuit board by a connecting element, and
- placing the electrical component in direct electrical contact with the flexible electrical connecting device and in direct electrical connection with at least two of the plurality of conductive tracks in the first contact region;
- wherein the electrical component is a switch including a contact element which is in direct electrical connection with the at least two of the plurality of the conductive tracks in the first contact region when the switch is depressed, and wherein the switch further comprises an edge element which is associated with the contact element, wherein the edge element is configured to carry out the functionality of the switch, wherein the edge element comprises a flexible material.

* * * * *